United States Patent [19]

Forsyth et al.

[11] Patent Number: 4,700,371
[45] Date of Patent: Oct. 13, 1987

[54] LONG LIFE X-RAY SOURCE TARGET

[75] Inventors: James M. Forsyth, Pittsford; Robert D. Frankel, Rochester, both of N.Y.

[73] Assignee: Hampshire Instruments, Inc., Rochester, N.Y.

[21] Appl. No.: 669,441

[22] Filed: Nov. 8, 1984

[51] Int. Cl.$^4$ .............................................. G21I 5/04
[52] U.S. Cl. .................................. 378/34; 378/119; 250/492.2
[58] Field of Search ................... 378/34, 35, 119; 250/492.2; 376/103

[56] References Cited

U.S. PATENT DOCUMENTS

| 4,058,486 | 11/1977 | Mallozzi et al. | 378/119 |
| 4,184,078 | 1/1980 | Nagel et al. | 378/34 |
| 4,484,339 | 11/1984 | Mallozzi et al. | 378/119 |
| 4,516,253 | 5/1985 | Novak | 378/35 |

OTHER PUBLICATIONS

"X-Ray Emission from Laser Irradiated Plane Solid Targets" by Eidmann et al., Journal of Applied Phys., vol. 47, No. 6, Jun. 1976, pp. 2402–2414.
"Target-Interaction Experiments at 0.53 μm and 0.35 μm" by Nagel et al., Lawrence Livermore Nat. Labs. 1980 Ann. Reports.
"Characteristics of Soft X-Ray Emission from a Plasma . . . " by Bykovskii et al., Sov. J. Quantum Electron, 9(2), Feb. 1979.
Memorandum "Soft X-Ray Emission" by Stomper et al., NRL Memorandum Report 7838, 10-1974.
"Repetitively Pulsed-Plasma Soft X-Ray Source" by Nagel et al., Applied Optics, vol. 23, No. 9, May 1984.

Primary Examiner—Craig E. Church
Assistant Examiner—John C. Freeman
Attorney, Agent, or Firm—Harry W. Barron

[57] ABSTRACT

Disclosed herein is an X-ray lithography system having a long life target. The life of the conventional target in X-ray generating systems for use in X-ray lithography systems is increased by providing means by which a single laser pulse can be provided to the same spot a plurality of times. In addition, new target designs are provided which are mechanically moved to allow laser pulses to be provided to adjacent points over a large surface area. One type of target is a cylindrical drum which is helically rotated to allow the laser pulse to intersect at all points along the helix of the drum. A second type of long life target is a long continuous strip in which a strip is moved from a feed reel to a take-up reel. The strip may be within a cassette.

20 Claims, 7 Drawing Figures

LONG LIFE X-RAY SOURCE TARGET

This invention relates to X-ray targets and more particularly to a long life target which is used in conjunction with an excitation beam to produce a plasma which emits soft X-rays for use in a commercial X-ray lithography system.

X-ray lithography systems are well known in the prior art. They were first suggested by Smith et al. in U.S. Pat. No. 3,743,842. As described in this patent, a source of X-rays was generated by directing an electron beam against a target placed in an evacuated chamber. The beam particles are of sufficient energy so that X-ray emission is excited at the point where the beam strikes the target. The emitted X-rays, in turn, are directed towards an X-ray resist covered semiconductor substrate to expose the resist. If an X-ray mask is placed between the target and the semiconductor, a patterned exposure can be formed on the resist coated substrate.

The X-ray lithography system of Smith was taken one step further as described in U.S. Pat. No. 4,184,078 to Nagel, et al. In this patent the electron beam is replaced by a laser beam pulse, which is directed towards a target to create the plasma which emits the X-rays. In the laser generated X-ray system, each time a laser pulse strikes the target, the temperature of the target material is raised to several million degrees, thereby forming the plasma. During the formation of the plasma, a certain amount of the target material is burnt away, leaving a small cavity in the target. In the prior art, when people have attempted to create X-rays by directing a subsequent laser pulse into the formed cavity, it had been determined that the intensity of the X-rays generated was substantially smaller. Thus, each time a new burst of X-rays was desired, either the target was moved so that the laser impinged on an unused flat area of the target or a new target was inserted. In either case, the apparatus described in the prior art is not useful in commercial applications because of the long time periods required to move the target from place to place or to replace the target while in the evacuated chamber. In present ultra-violet lithography systems, a semiconductor wafer is moved to the exposure area every one or two seconds. For X-ray lithography to be useful, it is necessary to provide a new laser shot to cause an X-ray plasma to be created each time the wafer is in position, which should be no less often than the same one or two seconds.

A significant additional problem in the prior art techniques has been the generation of a sufficient intensity of X-rays to actually expose the X-ray resist coated over the semiconductor wafer. In past techniques the power of the laser applied to the target was so small that it was necessary to fire the laser ten or more times in order to obtain a sufficient number of X-rays to totally expose the target. It is well known that increasing the power of the laser pulse will create a hotter plasma which, in turn, generates X-rays of a greater intensity. However practical limits may prevent delivery of a sufficiently powerful laser pulse.

One can also select different materials for the target to provide the maximum intensity X-rays. However, the X-rays may be desired to be at a certain wavelength and this will limit the choice of materials.

It would be preferable to have techniques available which will increase the intensity of the X-rays emitted from the plasma through the use of existing laser sources and target material.

In accordance with one aspect of this invention, there is provided an X-ray generating system comprising an excitation beam provided along a path and a target having a cavity therein. The target is positioned so that the cavity intersects the path and the beam is of sufficient power to cause an X-ray emitting plasma to be created at least partially within the cavity. In addition the system includes an object to be radiated by the emitted X-rays positioned within a certain angle of the path. The certain angle is that angle in which the intensity of the provided X-rays is greater than the intensity of the X-rays provided if a part of the target other than the cavity was positioned to intersect the path.

One preferred embodiment of the subject invention is hereafter described with specific reference being made to the following Figures, in which.

Figure 1:
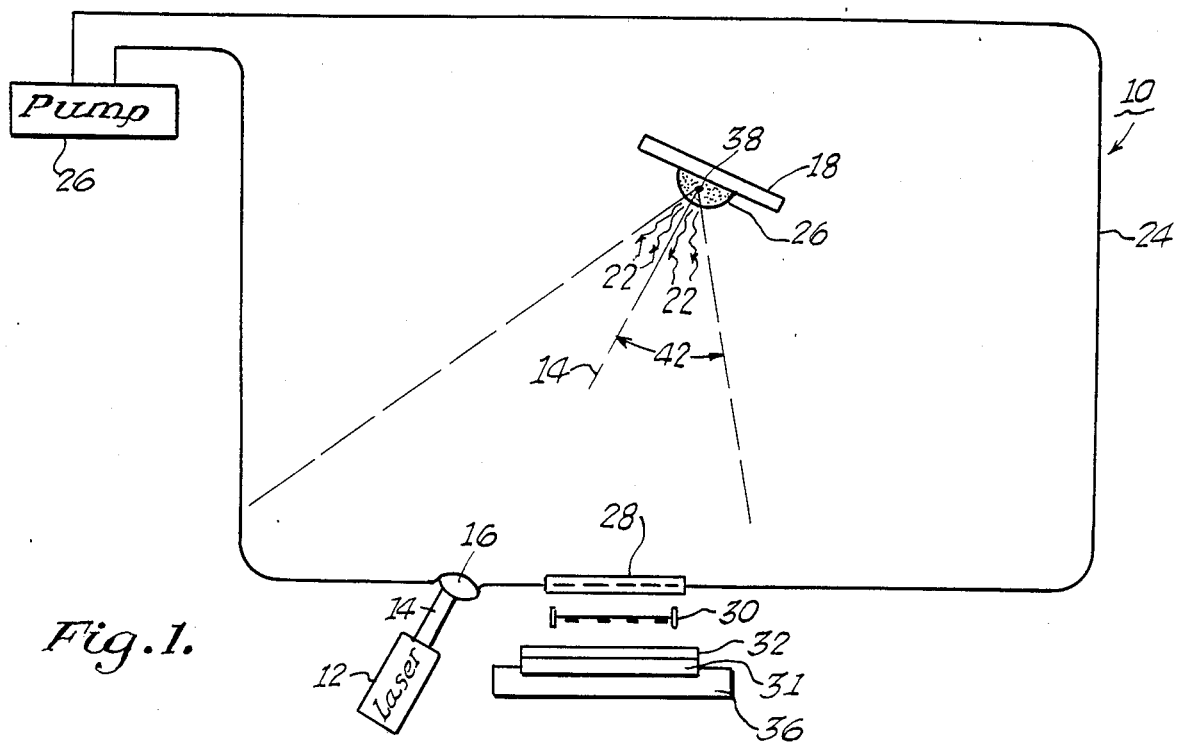
FIG. 1 shows an X-ray lithography system using a fixed target.

Referring now to FIG. 1, an X-ray lithography system 10 is shown which includes the laser generator 12 which generates a high powered pulse laser beam 14. Laser beam 14 is focused by a lens 16 onto a target 18. Target 18 may be of a material such as aluminum or stainless steel. The power contained in the laser beam 14 pulse focused on target 18 should be sufficient to cause a plasma to be created on target 18. The plasma in turn will generate soft X-rays in the range of two to twenty angstroms depending upon the material of target 18.

Target 18 must be in an evacuated chamber 24 which may be maintained at a pressure of 0.01 Torr by vacuum pump 26. Lens 16 may be positioned near the outer surface of chamber 24. An X-ray window 28 is also provided in chamber 24 to allow the X-rays 22 to travel from the interior of chamber 24 to the exterior thereof. Window 28 may be a suitable solid material, such as Beryllium, which is transparent to X-rays or it may be an aerodynamic jet stream such as described in co-pending U.S. patent application Ser. No. 669,442, filed Nov. 8, 1984, entitled "X-ray Lithography System" in the name of James Forsyth.

External to chamber 24 is positioned an X-ray mask for providing an image of X-rays to a semiconductor wafer 32 covered by X-ray resist material 34. Wafer handler means 36 is provided to move the wafer to various positions so that different areas may be exposed to the pattern of X-rays defined by mask 30. Such wafer handling equipment is shown in U.S. Pat. No. 4,444,492 in the name of Martin E. Lee and entitled "Apparatus for Projecting a Series of Images onto Dies of a Semiconductor Wafer".

System 10, as heretofore described is typical of the prior art taught by Smith et al., or Nagel et al. System 10 operates by a single pulse 14 from laser 12 being provided and focused by lens 16 at a spot 38 of target 18. The focused laser pulse creates a plasma 20 which emits X-rays 22. The X-rays travel throughout chamber 24 and in particular through window 28 and mask 30 to cause a pattern to be exposed on photoresist 34. In the prior art, target 18 is either manually moved or replaced after each laser pulse is applied thereto and the same procedure repeated. Due to the long length of time required to manually move or replace target 18, the practicalities of using the prior art versions of system 10 are quite limited. Conventional lithography equipment, such as the photolithography systems described in the aforementioned U.S. Pat. No. 4,444,492, include wafer handling means 36 which allow exposures to occur approximately every two seconds. Thus, the long time required to manually move or replace target 18 can not take advantage of state of the art wafer handling means 36.

The teachings of the prior art also suggest that it is improper to provide more than one pulse from laser 12 towards the same spot 38 on target 18. Each time a pulse is applied and a plasma created, a certain amount of material of target 18 is burnt away due to the tremendous heat of the plasma. This results in a cavity being formed on the surface of target 18 at point 38 where laser beam 14 strikes target 18. In the past where experimenters have tried to direct a second laser beam into the formed cavity, the determination was that a much lower intensity of X-rays were formed. In these experiments the detector for X-ray intensity was placed at an angle equal to or greater than 45 degrees away from the path of beam 14.

Figures 2A, 2B, 2C, 2D:
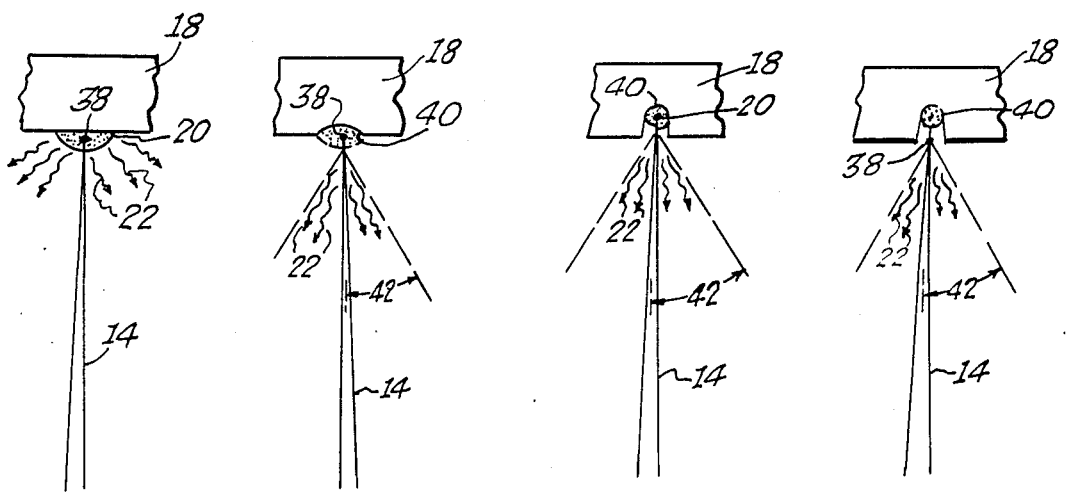
FIGS. 2A, 2B, 2C and 2D show the formation of a cavity in the target after several applications of a laser pulse to the target.

Referring now to FIGS. 2A, 2B, 2C and 2D an explanation of what occurs when the series of laser beam pulses are applied to target 18 will be given. In FIG. 2A laser beam 14 strikes target 18 at point 38 causing a plasma 20 to be created and X-rays 22 to be emitted from plasma 20. As seen in FIG. 2A, plasma 20 is created essentially on the outer surface of target 18. The X-rays 22 are provided with an approximate equal intensity throughout the entire area below target 18. After the plasma 20 has dissipated in FIG. 2A a cavity 40 is formed, as shown in FIG. 2B. The cross sectional area of cavity 40 is larger than the cross sectional area of laser beam 14 at the point beam 14 strikes target 18 and the resulting cavity 40 has a smaller cross sectional area than does the initial plasma, as seen in FIG. 2A. As additional laser pulses 14 are applied against target 18 and focused on spot 38, cavity 40 increases in depth as shown in FIGS. 2C and 2D. As cavity 40 is formed and increases in depth, plasma 20 is created within the cavity 40 until at point, as shown in FIGS. 2C and 2D, plasma 20 is wholly within cavity 40. Laser pulses could continue to be focused on point 38 and cavity 40 would become deeper as shown by the dashed lines in FIG. 2D.

As cavity 40 increases in depth and plasma 20 is formed within the cavity, the temperature of plasma 40 increases due to the more confined area in which it is formed. This causes a greater intensity of X-rays to be emitted. In addition, these X-rays are confined to a certain cone surrounding laser beam 14 and represented by the conical angle 42 as shown in FIGS. 2B, 2C and 2D. Thus, the intensity of the X-rays within the cone defined by angle 42 is significantly greater than the intensities beyond the cone. In fact, the intensity of the X-rays beyond the cone defined by angle 42 is significantly less than the intensity of the X-rays formed in FIG. 2A. This phenomena of a significantly higher intensity of X-rays within the cone defined by angle 42 escaped detection in the prior art experimentations because of positioning of the X-ray detector outside of the cone defined by angle 42.

As the depth of cavity 40 increases, the angle of the cone defined by angle 42 decreases. X-rays are absorbed into the side of the cavity wall, thereby creating additional heat. The higher plasma density caused by the confinement of the cavity walls causes the plasma in the cavity to act more as an ideal radiator, thereby increasing the intensity of the X-rays.

Experiments have shown that cavities which produce significant increases in X-ray output will be deep enough below the point 38 to cause angle 42 to be approximately 45 degrees. If the cavity is formed by a prior/focused laser pulse, successive laser pulses focused into the cavity will cause the cavity to become deeper, reducing the available cone angle 42. The intensity of the X-rays within the cone defined by angle 42 may be two or more times greater than the intensity of the X-rays formed, for instance, as shown in FIG. 2A. Repeated irradiation of the cavity by many laser pulses eventually causes the X-ray emission within the cone angle 42 to decline. This occurs because the outer walls of the cavity serve to act as a heat sink for the hot plasma created at the bottom of the cavity. This colder material acts to absorb some of the X-ray radiation under these conditions. Empirically, a range of cavity depths produced by one or more focused laser pulses of from 0.3 to 0.8 mm is found to produce significantly enhanced X-ray emission within cone angle 42.

Referring again to FIG. 1, in order to take advantage of the phenomena of the higher intensity X-rays within the cone defined by angle 42, laser 12 and lens 16 are positioned so that the window 28, mask 30 and the portion of semiconductor wafer 32 being exposed are all positioned within the critical angle 42 of the cone of high intensity X-rays. This requires that lens 16 be placed in close proximity to window 28. This may require the use of directing mirrors so that laser 12 does not interfere with the wafer handling device 36 as it moves wafer 34 between the various positions to be exposed.

By placing mask 30 and the area of wafer 32 which is to be exposed within the cone defined by angle 42, significant advantages are achieved. First a lower powered laser 12 may be used to generate the necessary intensity of X-rays to expose the X-ray resist 34. Further, with a higher intensity of X-rays, different types of X-ray resist material may be used. Further, the ability to direct a plurality of laser pulses at the same point allows multiple exposures to be obtained without having to move or replace target 18.

Figure 3:
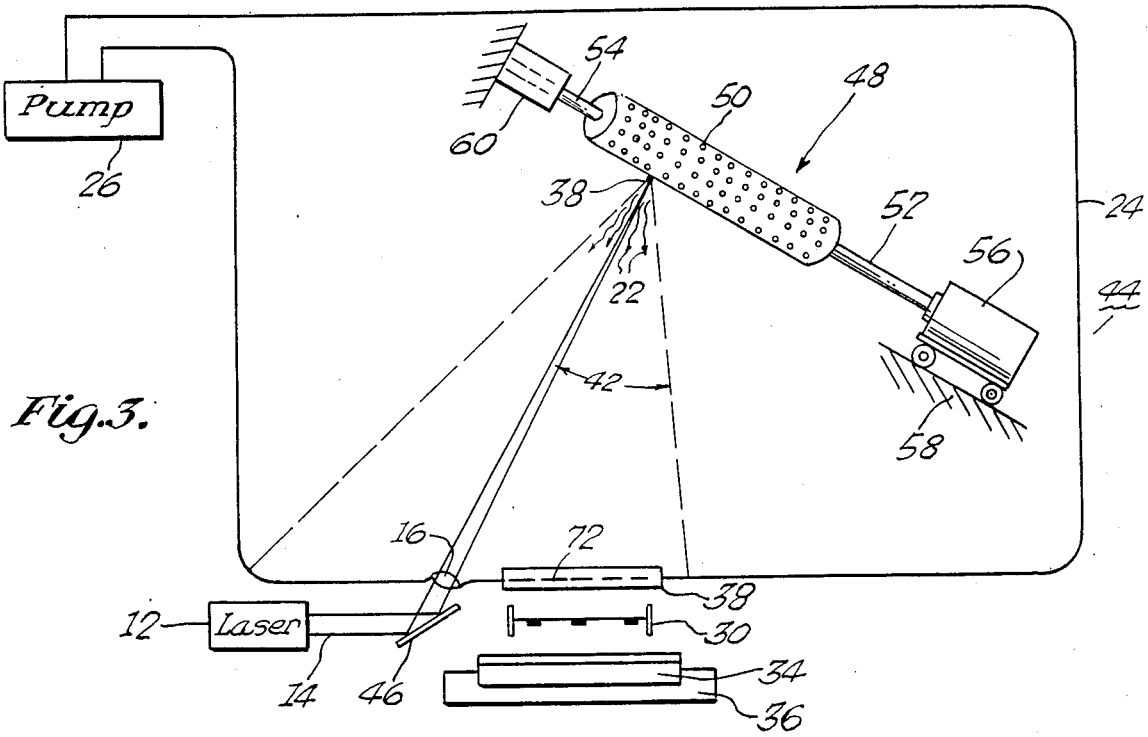
FIG. 3 shows an X-ray lithography system having a first type of movable target mechanism.

Referring now to FIG. 3, a different configuration target is shown which can be mechanically moved so that a large quantity of X-ray exposures can be easily and automatically obtained without having to physically change the target. In FIG. 3, where like components to FIG. 1 are shown, they are given like numeric reference numbers. In FIG. 3, the X-ray lithography system 44 includes a mirror 46 for directing the laser beam 14 from laser 12 through lens 16. The other difference is that target 18 shown in FIG. 1 is replaced by target system 48. Target system 48 includes a cylindrical drum 50 constructed of an appropriate material useful as a target. Such material may be aluminum or stainless steel as previously mentioned. Attached to the sides of cylinder 50 is a shaft 52 and a threaded rod 54. A motor 56 is attached to shaft 52 for rotating shaft 52, which in turn rotates drum 50. Motor 56 rides on a rail 58. Threaded rod 54, which is attached to the other side of cylinder 50, is applied into a threaded chamber 60. As motor 56 turns shaft 52 and cylindrical drum 50, rod 54 moves into chamber 60, thereby causing lateral movement of the entire target system 48. During this movement motor 56 rides along rails 58.

In operation, cylindrical drum 50 is positioned so that laser beam 14 is applied initially at one end thereof. After an appropriate number of laser beam 14 pulses have been applied to a particular spot on drum 50, drum 50 is rotated a small amount. This allows a new series of pulses to be applied to a point just adjacent to the prior point to which the laser pulses were previously applied. As drum 50 continues to be rotated a small amount each time, a helical path of target points is formed. The amount in which drum 50 is rotated is determined by the diameter of the cavity 40 shown in FIGS. 2B, 2C and 2D. As cavity 40 is a very small size, in the order of 0.5 mm or less, the number of cavities permitted per rotation of drum 50 is great. Of course the size of drum 50 will determine the actual number of available spots to create cavities. Further the lateral movement per rotation will be quite small. The actual size of drum 50 can be selected so that a large number of target positions can be obtained. This will allow the target to be used for a long period of time before replacement is necessary.

Figure 4:
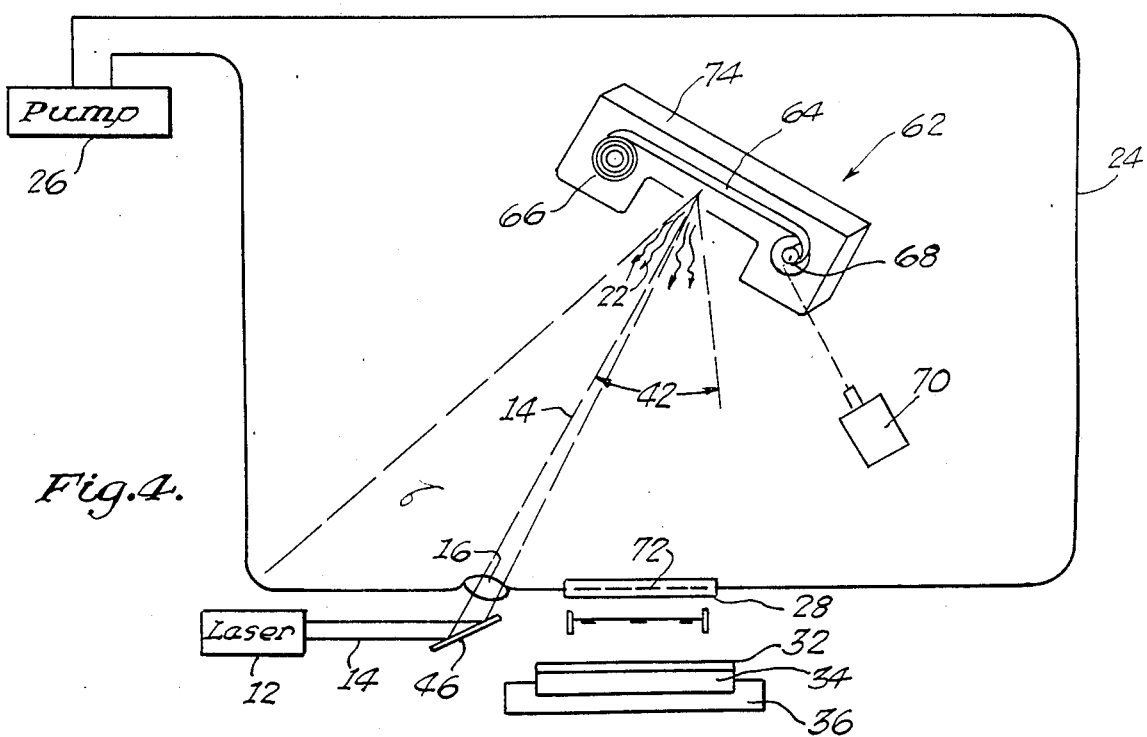
FIG. 4 shows an X-ray lithography system having a second type of movable target mechanism.

Referring now to FIG. 4, an alternate target system 62 is shown which likewise will provide a large number of target areas. Target system 62 includes a long target strip 64, which initially is totally wound around a feed reel 66 and threaded to a take-up reel 68. Take-up reel 68 is driven by a motor 70 to cause strip 66 to move in short increments past point 38 at which laser beam 14 is focused. Target system 62 may be fabricated into a cassette 74 for easy removal and replacement. Lateral movement of the cassette 74 may also be provided to increase the number of target spots available. In the alternative means associated with mirror 46 could direct the laser beam 14 pulses at selected locations perpendicular to the path of movement of strip 64.

In using both long life target systems 48, shown in FIG. 3, and 62 shown in FIG. 4, it is necessary to provide the initial cavity 40 on the target. This may be accomplished by providing an initial laser pulse to either drum 50 or strip 64 while blocking the X-rays provided through window 28 from reaching mask 30. Such blockage may be accomplished by providing a shutter 72 within window 28. Shutter 72 may be an X-ray absorbing material strobed across window 28 in conjunction with the formation of cavity 40. In the alternative, a higher energy laser beam pulse could be provided initially to cause a greater intensity of X-rays throughout the entire area of chamber 24. Thereafter, lower energy laser pulses 14 would be provided. By controlling the energy within each of the laser pulses 14 provided against the target 50 or 64, the intensity of the X-rays passing through window 28 can be controlled. Further, an initialization procedure could be devised where the initial cavities are all created before the chip handling mean 36 moves the chip 32 into position. If such a procedure were utilized, means would be required to initialize the target position so that after initialization, laser pulses would be directed into the performed cavities.

What I claim is:

1. An x-ray generating system comprising:
    means for providing an excitation beam along a path;
    a target having a cavity therein, said target being positioned so that said cavity intersects said path, said beam being of sufficient power to cause an X-ray emitting plasma to be created at least partially within said cavity; and
    an object to be irradiated by said emitted X-rays positioned within a certain angle of said path, said certain angle being that angle with respect to said path within which the intensity of the provided X-rays is significantly greater than the intensity of the X-rays provided if a part of said target, other than said cavity, was positioned to intersect said path.

2. The invention according to claim 1 wherein said cavity is formed by said excitation beam being directed towards a noncavity area of said target.

3. The invention according to claim 1 wherein said excitation beam is a laser pulse.

4. The invention according to claim 1 wherein said cavity has a smaller cross sectional area than the cross sectional area of the plasma created when said beam strikes a noncavity area of said target.

5. The invention according to claim 4 wherein said cavity has cross sectional area larger than the cross sectional area of said beam at the point said beam strikes said cavity.

6. The invention according to claim 5 wherein said excitation beam is a laser pulse.

7. The invention according to claim 1 wherein said cavity has a cross-sectional area larger than the cross sectional area of said beam at the point said beam strikes said cavity.

8. The invention according to claim 7 wherein said cavity is formed by said excitation beam being directed towards a noncavity area of said target.

9. The invention according to claim 1 wherein said beam is directed towards said cavity a pluality of times.

10. The invention according to claim 9 wherein said cavity increases in depth after each time said beam is directed towards said cavity.

11. The invention according to claim 10 wherein said cavity is formed by said excitation beam being directed towards a noncavity area of said target.

12. The invention according to claim 11:
    wherein the intensity of the X-rays emitted towards said object during the initial formation of said cavity is less than the intensity of the X-rays emitted thereafter; and
    wherein said system further comprises means to prevent the X-rays emitted during formation of the cavity from striking said object.

13. The invention according to claim 1:
    wherein said object is at least one desired area on a semiconductor substrate;
    wherein said cavity is formed by said beam being directed towards a noncavity area of said target; and
    wherein said system further comprises means to prevent X-rays generated during the formation of said cavity from irradiating said desired area of said substrate.

14. In an X-ray generating system having excitation beam generating means, target means, and an object to be irradiated with X-rays, said excitation beam being directed to intersect a surface of said target means with sufficient power to create an X-ray plasma at the point said beam intersects said target means, said X-rays being emitted towards said object, the improvement comprising:
    a cavity on the surface of said target means;

means for causing said beam to intersect said cavity; and means for positioning said object within a critical angle of said beam in which the intensity of the X-rays emitted exceeds the intensity of the X-rays emitted when said beam intersects an area of said target other than a cavity.

15. The invention according to claim 14 wherein said target is metal.

16. The invention according to claim 15 wherein said object is a semiconductor substrate.

17. The invention according to claim 16 wherein said target is positioned within an evacuated chamber.

18. The invention according to claim 14 wherein said cavity is formed by said beam being directed towards an area of said target not having a cavity, said beam thereafter being directed into said formed cavity.

19. The invention according to claim 18 wherein said beam is repeatedly directed into said cavity a plurality of times.

20. An X-ray lithography system comprising:

a high repetition rate, high power laser pulse generator;

a target towards which said laser pulse is directed, said target being of a material in which a soft X-ray emitting plasma is created each time a laser pulse is directed towards said target, said target having a cavity therein formed by at least one prior laser pulse having been directed towards said target and positioned so that at least one subsequent laser pulse is directed into said cavity to create at least a portion of said plasma in said cavity, so that a region significantly of higher intensity X-rays results; and semiconductor wafer holding and moving means for positioning selected areas of a semiconductor wafer in an exposing area, said exposing are being within said significantly higher intensity X-ray region resulting from said plasma being formed at least partially within said cavity.

* * * * *